US012287088B2

(12) United States Patent
Van Bommel et al.

(10) Patent No.: US 12,287,088 B2
(45) Date of Patent: Apr. 29, 2025

(54) COLOR CONTROL USING A HIGH FREQUENCY WAVELENGTH SWEEPING LIGHT SOURCE AND A PHOSPHOR

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 0 days.

(21) Appl. No.: 18/691,148

(22) PCT Filed: Sep. 12, 2022

(86) PCT No.: PCT/EP2022/075291
§ 371 (c)(1),
(2) Date: Mar. 12, 2024

(87) PCT Pub. No.: WO2023/041486
PCT Pub. Date: Mar. 23, 2023

(65) Prior Publication Data
US 2024/0392948 A1    Nov. 28, 2024

(30) Foreign Application Priority Data

Sep. 14, 2021  (EP) .................................... 21196577

(51) Int. Cl.
*H05B 45/20*       (2020.01)
*F21V 9/40*        (2018.01)
(Continued)

(52) U.S. Cl.
CPC ............... *F21V 9/40* (2018.02); *H05B 45/20* (2020.01); *H05B 45/325* (2020.01); *F21Y 2115/10* (2016.08); *F21Y 2115/30* (2016.08)

(58) Field of Classification Search
CPC ... H05B 45/20; H05B 45/325; H01L 33/0045; F21V 9/30; F21V 9/08; F21K 9/64
See application file for complete search history.

(56) References Cited

U.S. PATENT DOCUMENTS 3,875,456 A * 4/1975 Kano ..................... H05B 33/00
                                             257/E33.059
5,420,482 A * 5/1995 Phares ................. H05B 47/155
                                             315/300

(Continued)

FOREIGN PATENT DOCUMENTS

| JP | 2015528187 A | 9/2015 |
| JP | 2015233127 A | 12/2015 |

(Continued)

*Primary Examiner* — Ismael Negron

(57) ABSTRACT

A light generating system includes first light generating device configured to generate a first wavelength variable light changing between at least two centroid wavelengths having a difference of at least 10 nm, with a changing frequency of at least 50 Hz; a second light generating device configured to generate a second light having a different spectral power distribution from that of the first light generating device; and a luminescent material configured to convert at least part of one or more of the first or the second lights into luminescent light. The light generating system is configured to generate white system light including the luminescent light, the first device light, and the second device light.

15 Claims, 7 Drawing Sheets

(51) Int. Cl.
*H05B 45/325* (2020.01)
*F21Y 115/10* (2016.01)
*F21Y 115/30* (2016.01)

(56) References Cited

U.S. PATENT DOCUMENTS

| | | | | |
|---|---|---|---|---|
| 5,535,230 | A * | 7/1996 | Abe | F21K 9/69 |
| | | | | 372/50.23 |
| 6,350,041 | B1 * | 2/2002 | Tarsa | F21V 9/20 |
| | | | | 362/345 |
| 7,005,679 | B2 * | 2/2006 | Tarsa | H01L 25/0753 |
| | | | | 315/246 |
| 7,220,039 | B2 * | 5/2007 | Ahn | G02B 6/0068 |
| | | | | 362/555 |
| 7,316,497 | B2 * | 1/2008 | Rutherford | H04N 9/315 |
| | | | | 362/628 |
| 7,982,229 | B2 * | 7/2011 | Bechtel | F21K 9/64 |
| | | | | 257/98 |
| 8,884,508 | B2 * | 11/2014 | Pickard | H05B 45/00 |
| | | | | 362/249.02 |
| 9,482,937 | B2 * | 11/2016 | Cheng | G03B 21/2033 |
| 9,810,826 | B2 * | 11/2017 | Chestakov | F21S 41/153 |
| 11,150,548 | B2 * | 10/2021 | Suzuki | G03B 21/2066 |
| 2011/0170290 | A1 * | 7/2011 | Hikmet | H05B 45/20 |
| | | | | 362/235 |
| 2018/0316160 | A1 | 11/2018 | Raring et al. | |
| 2019/0348813 | A1 | 11/2019 | Johnson et al. | |
| 2020/0232610 | A1 | 7/2020 | Raring et al. | |
| 2020/0232618 | A1 | 7/2020 | Rudy et al. | |
| 2021/0092811 | A1 | 3/2021 | Qiu | |

FOREIGN PATENT DOCUMENTS

| | | |
|---|---|---|
| JP | 2017536694 A | 12/2017 |
| JP | 2018511386 A | 4/2018 |
| WO | 2004107512 A1 | 12/2004 |
| WO | 2019020395 A1 | 1/2019 |

* cited by examiner

US 12,287,088 B2

COLOR CONTROL USING A HIGH FREQUENCY WAVELENGTH SWEEPING LIGHT SOURCE AND A PHOSPHOR

CROSS-REFERENCE TO PRIOR APPLICATIONS

This application is the U.S. National Phase application under 35 U.S.C. § 371 of International Application No. PCT/EP2022/075291, filed on Sep. 12, 2022. These applications are hereby incorporated by reference herein.

FIELD OF THE INVENTION

The invention relates to a light generating system. The invention further relates to a light generating device comprising such light generating system.

BACKGROUND OF THE INVENTION

Devices comprising vertical cavity lasers are known in the art. For instance, WO2004/107512 describes a white-light laser integrated structure comprising: a) a substrate and b) one or more individually addressable laser light pixels formed on the substrate for emitting a white beam of laser light perpendicular to the substrate, each of the one or more individually addressable laser light pixels include one or more organic light emitting diodes (OLEDs) and a plurality of organic vertical cavity lasers that are arranged to be optically pumped by the one or more OLEDs, wherein the plurality of organic vertical cavity lasers emit differently colored light and the one or more individually addressable laser light emitting pixels emit substantially white light when the differently colored light is combined. The plurality of organic vertical cavity lasers emits two different colors of light.

SUMMARY OF THE INVENTION

While white LED sources can give an intensity of e.g. up to about 300 lm/mm$^2$; static phosphor converted laser white sources can give an intensity even up to about 20.000 lm/mm$^2$. Ce doped garnets (e.g. YAG, LuAG) may be the most suitable luminescent convertors which can be used for pumping with blue laser light as the garnet matrix has a very high chemical stability. Further, at low Ce concentrations (e.g. below 0.5%) temperature quenching may only occur above about 200° C. Furthermore, emission from Ce has a very fast decay time so that optical saturation can essentially be avoided. Assuming e.g. a reflective mode operation, blue laser light may be incident on a phosphor. This may in embodiments realize almost full conversion of blue light, leading to emission of converted light. It is for this reason that the use of garnet phosphors with relatively high stability and thermal conductivity is suggested. However, also other phosphors may be applied. Heat management may remain an issue when extremely high-power densities are used.

High brightness light sources can be used in applications such as projection, stage-lighting, spot-lighting and automotive lighting. For this purpose, laser-phosphor technology can be used wherein a laser provides laser light and e.g. a (remote) phosphor converts laser light into converted light. The phosphor may in embodiments be arranged on or inserted in a heatsink for improved thermal management and thus higher brightness.

One of the problems that may be associated with such (laser) light sources is the heat management of the (ceramic) phosphor. Other problems associated with such laser light sources may be the desire to create compact high power devices. Further, it appears desirable to provide light sources that are wavelength tunable. In general, laser-based light sources, however, are not wavelength tunable.

Hence, it is an aspect of the invention to provide an alternative light generating system, which preferably further at least partly obviates one or more of above-described drawbacks. The present invention may have as object to overcome or ameliorate at least one of the disadvantages of the prior art, or to provide a useful alternative.

In an aspect, the invention provides a light generating system ("system") comprising a first light generating device, a second light generating device, and a luminescent material. Especially, the first light generating device may be configured to generate first device light. Further, especially the second light generating device may be configured to generate second device light. Further, especially (in an operational mode of the system) the first device light and the second device light have different spectral power distributions. Further, especially the luminescent material may be configured to convert at least part of one or more of (a) the first device light and (b) the second device light into luminescent material light. Especially, the first light generating device may comprise a wavelength variable light generating device. The wavelength variable light generating device may configured to generate in an operational mode of the light generating system first device light changing between at least two centroid wavelengths ($\lambda_{1c,1}$, $\lambda_{1c,2}$) (of the first light). Especially, the two centroid wavelengths may have a wavelength difference of at least 10 nm, such as at least 20 nm. Further, the wavelength variable light generating device may configured to generate in an operational mode of the light generating system first device light changing between at least two centroid wavelengths ($\lambda_{1c,1}$, $\lambda_{1c,2}$), with a changing frequency of at least 40 Hz, especially at least 50 Hz. Further, the light generating system may be configured to generate in the operational mode of the light generating system white system light comprising the luminescent material light, and at least one of the first device light and the second device light. Especially, in embodiments the invention provides a light generating system comprising a first light generating device, a second light generating device, and a luminescent material, wherein: (A) the first light generating device is configured to generate first device light; the second light generating device is configured to generate second device light; wherein the first device light and the second device light have different spectral power distributions; (B) the luminescent material is configured to convert at least part of one or more of the first device light and the second device light into luminescent material light; (C) the first light generating device comprises a wavelength variable light generating device configured to generate in an operational mode of the light generating system first device light changing between at least two centroid wavelengths ($\lambda_{1c,1}$, $\lambda_{1c,2}$) having a wavelength difference of at least 10 nm, with a changing frequency of at least 40 Hz; and (D) the light generating system is configured to generate in the operational mode of the light generating system white system light comprising the luminescent material light, and (at least one of) the first device light and the second device light.

With such system, it is possible to provide a relatively large color gamut and/or a relatively large CCT tunability with a limited number of light sources. Further, with such system, it may be possible to provide white light with a controllable CCT (substantially along the black body locus). Yet further, with a limited number of light sources, a relatively high CRI may be provided. Further, relatively intense light may be provided with the system.

As indicated above, the light generating system may especially comprise a first light generating device, a second light generating device, and a luminescent material.

Especially, the first light generating device is configured to generate first device light. Further, especially the second light generating device is configured to generate second device light. Especially, in an operational mode of the system, the first device light and the second device light have different spectral power distributions.

The first light generating device may comprise one or more (first) light sources, more especially one or more (first) solid state light sources. Further, the first light generating device may comprise optics. Light, i.e. first light source light (from the one or more first light sources), escaping from the one or more light sources may in embodiments be beam shaped via the optics. First device light may especially comprise the first light source light. More especially, the first device light may consist of the (first light source) light of the one or more first light sources.

The second light generating device may comprise one or more (second) light sources, more especially one or more (second) solid state light sources. Further, the second light generating device may comprise optics. Light, i.e. second light source light (from the one or more second light sources), escaping from the one or more light sources may in embodiments be beam shaped via the optics. Second device light may especially comprise the second light source light. More especially, the second device light may consist of the (second light source) light of the one or more second light sources.

Below some general aspects in relation to light sources are described, which may apply for the (light sources of the) first light generating device and the (light sources of the) second light generating device.

The term "light source" may in principle relate to any light source known in the art. It may be a conventional (tungsten) light bulb, a low pressure mercury lamp, a high pressure mercury lamp, a fluorescent lamp, a LED (light emissive diode).

In a specific embodiment, the light source comprises a solid state LED light source (such as a LED or laser diode (or "diode laser")).

The term "light source" may also relate to a plurality of light sources, such as 2-200 (solid state) LED light sources. Hence, the term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of light emitting semiconductor light source may be configured on the same substrate. In embodiments, a COB is a multi LED chip configured together as a single lighting module.

The light source has a light escape surface. Referring to conventional light sources such as light bulbs or fluorescent lamps, it may be outer surface of the glass or quartz envelope. For LED's it may for instance be the LED die, or when a resin is applied to the LED die, the outer surface of the resin. In principle, it may also be the terminal end of a fiber. The term escape surface especially relates to that part of the light source, where the light actually leaves or escapes from the light source. The light source is configured to provide a beam of light. This beam of light (thus) escapes from the light exit surface of the light source.

Likewise, a light generating device may comprise a light escape surface, such as an end window. Further, likewise a light generating system may comprise a light escape surface, such as an end window.

The term "light source" may refer to a semiconductor light-emitting device, such as a light emitting diode (LEDs), a resonant cavity light emitting diode (RCLED), a vertical cavity laser diode (VCSELs), an edge emitting laser, etc. The term "light source" may also refer to an organic light-emitting diode (OLED), such as a passive-matrix (PMOLED) or an active-matrix (AMOLED). In a specific embodiment, the light source comprises a solid-state light source (such as a LED or laser diode). In an embodiment, the light source comprises a LED (light emitting diode). The terms "light source" or "solid state light source" may also refer to a superluminescent diode (SLED).

The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi-LED chip configured together as a single lighting module.

The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering).

In embodiments, the light source may be configured to provide primary radiation, which is used as such, such as e.g. a blue light source, like a blue LED, or a green light source, such as a green LED, and a red light source, such as a red LED. Such LEDs, which may not comprise a luminescent material ("phosphor") may be indicated as direct color LEDs.

In other embodiments, however, the light source may be configured to provide primary radiation and part of the primary radiation is converted into secondary radiation. Secondary radiation may be based on conversion by a luminescent material. The secondary radiation may therefore also be indicated as luminescent material radiation. The luminescent material may in embodiments be comprised by the light source, such as a LED with a luminescent material layer or dome comprising luminescent material. Such LEDs may be indicated as phosphor converted LEDs or PC LEDs (phosphor converted LEDs). In other embodiments, the luminescent material may be configured at some distance ("remote") from the light source, such as a LED with a luminescent material layer not in physical contact with a die of the LED. Hence, in specific embodiments the light source may be a light source that during operation emits at least light at wavelength selected from the range of 380-470 nm. However, other wavelengths may also be possible. This light may partially be used by the luminescent material.

In embodiments, the light generating device may comprise a luminescent material. In embodiments, the light generating device may comprise a PC LED. In other embodiments, the light generating device may comprise a direct LED (i.e. no phosphor). In embodiments, the light generating device may comprise a laser device, like a laser diode. In embodiments, the light generating device may comprise a superluminescent diode. Hence, in specific embodiments, the light source may be selected from the group of laser diodes and superluminescent diodes. In other embodiments, the light source may comprise an LED.

The light source may especially be configured to generate light source light having an optical axis (O), (a beam shape,) and a spectral power distribution. The light source light may in embodiments comprise one or more bands, having band widths as known for lasers.

The term "light source" may (thus) refer to a light generating element as such, like e.g. a solid state light source, or e.g. to a package of the light generating element, such as a solid state light source, and one or more of a luminescent material comprising element and (other) optics, like a lens, a collimator. A light converter element ("converter element" or "converter") may comprise a luminescent material comprising element. For instance, a solid state light source as such, like a blue LED, is a light source. A combination of a solid state light source (as light generating element) and a light converter element, such as a blue LED and a light converter element, optically coupled to the solid state light source, may also be a light source (but may also be indicated as light generating device). Hence, a white LED is a light source (but may e.g. also be indicated as (white) light generating device).

The term "light source" herein may also refer to a light source comprising a solid state light source, such as an LED or a laser diode or a superluminescent diode.

The "term light source" may (thus) in embodiments also refer to a light source that is (also) based on conversion of light, such as a light source in combination with a luminescent converter material. Hence, the term "light source" may also refer to a combination of a LED with a luminescent material configured to convert at least part of the LED radiation, or to a combination of a (diode) laser with a luminescent material configured to convert at least part of the (diode) laser radiation.

In embodiments, the term "light source" may also refer to a combination of a light source, like a LED, and an optical filter, which may change the spectral power distribution of the light generated by the light source. Especially, the "term light generating device" may be used to address a light source and further (optical components), like an optical filter and/or a beam shaping element, etc.

The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The term "solid state light source", or "solid state material light source", and similar terms, may especially refer to semiconductor light sources, such as a light emitting diode (LED), a diode laser, or a superluminescent diode.

The term "laser light source" especially refers to a laser. Such laser may especially be configured to generate laser light source light having one or more wavelengths in the UV, visible, or infrared, especially having a wavelength selected from the spectral wavelength range of 200-2000 nm, such as 300-1500 nm. The term "laser" especially refers to a device that emits light through a process of optical amplification based on the stimulated emission of electromagnetic radiation.

Especially, in embodiments the term "laser" may refer to a solid-state laser. In specific embodiments, the terms "laser" or "laser light source", or similar terms, refer to a laser diode (or diode laser).

Hence, in embodiments the light source comprises a laser light source. In embodiments, the terms "laser" or "solid state laser" or "solid state material laser" may refer to one or more of cerium doped lithium strontium (or calcium) aluminum fluoride (Ce:LiSAF, Ce:LiCAF), chromium doped chrysoberyl (alexandrite) laser, chromium ZnSe (Cr:ZnSe) laser, divalent samarium doped calcium fluoride (Sm:CaF$_2$) laser, Er:YAG laser, erbium doped and erbium-ytterbium codoped glass lasers, F-Center laser, holmium YAG (Ho: YAG) laser, Nd:YAG laser, NdCrYAG laser, neodymium doped yttrium calcium oxoborate Nd:YCa$_4$O(BO$_3$)$_3$ or Nd:YCOB, neodymium doped yttrium orthovanadate (Nd: YVO$_4$) laser, neodymium glass (Nd:glass) laser, neodymium YLF (Nd:YLF) solid-state laser, promethium 147 doped phosphate glass (147Pm$^{3+}$:glass) solid-state laser, ruby laser (Al$_2$O$_3$:Cr$^{3+}$), thulium YAG (Tm:YAG) laser, titanium sapphire (Ti:sapphire; Al$_2$O$_3$:Ti$^{3+}$) laser, trivalent uranium doped calcium fluoride (U:CaF$_2$) solid-state laser, Ytterbium doped glass laser (rod, plate/chip, and fiber), Ytterbium YAG (Yb:YAG) laser, Yb$_2$O$_3$ (glass or ceramics) laser, etc.

For instance, including second and third harmonic generation embodiments, the light source may comprise one or more of an F center laser, an yttrium orthovanadate (Nd: YVO$_4$) laser, a promethium 147 doped phosphate glass (147Pm$^{3+}$:glass), and a titanium sapphire (Ti:sapphire; Al$_2$O$_3$:Ti$^{3+}$) laser. For instance, considering second and third harmonic generation, such light sources may be used to generated blue light.

In embodiments, the terms "laser" or "solid state laser" or "solid state material laser" may refer to one or more of a semiconductor laser diodes, such as GaN, InGaN, AlGaInP, AlGaAs, InGaAsP, lead salt, vertical cavity surface emitting laser (VCSEL), quantum cascade laser, hybrid silicon laser, etc.

A laser may be combined with an upconverter in order to arrive at shorter (laser) wavelengths. For instance, with some (trivalent) rare earth ions upconversion may be obtained or with non-linear crystals upconversion can be obtained. Alternatively, a laser can be combined with a downconverter, such as a dye laser, to arrive at longer (laser) wavelengths.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank (see also above). The laser bank may in embodiments comprise heat sinking and/or optics e.g. a lens to collimate the laser light.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources. In specific embodiments, the light source light is thus especially collimated light source light. In yet further embodiments, the light source light is especially (collimated) laser light source light.

The laser light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

The beams (of light source light) may be focused or collimated beams of (laser) light source light. The term "focused" may especially refer to converging to a small spot. This small spot may be at the discrete converter region, or (slightly) upstream thereof or (slightly) downstream thereof. Especially, focusing and/or collimation may be such that the cross-sectional shape (perpendicular to the optical axis) of the beam at the discrete converter region (at the side face) is essentially not larger than the cross-section shape (perpendicular to the optical axis) of the discrete converter region (where the light source light irradiates the discrete converter region). Focusing may be executed with one or more optics, like (focusing) lenses. Especially, two lenses may be applied to focus the laser light source light. Collimation may be executed with one or more (other) optics, like collimation elements, such as lenses and/or parabolic mirrors. In embodiments, the beam of (laser) light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Optics may be used to provide (high) collimation (see also above).

The term "solid state material laser", and similar terms, may refer to a solid state laser like based on a crystalline or glass body dopes with ions, like transition metal ions and/or lanthanide ions, to a fiber laser, to a photonic crystal laser, to a semiconductor laser, such as e.g. a vertical cavity surface-emitting laser (VCSEL), etc.

The term "solid state light source", and similar terms, may especially refer to semiconductor light sources, such as a light emitting diode (LED), a diode laser, or a superluminescent diode.

Superluminescent diodes are known in the art. A superluminescent diode may be indicated as a semiconductor device which may be able to emit low-coherence light of a broad spectrum like a LED, while having a brightness in the order of a laser diode.

US2020192017 indicates for instance that "With current technology, a single SLED is capable of emitting over a bandwidth of, for example, at most 50-70 nm in the 800-900 nm wavelength range with sufficient spectral flatness and sufficient output power. In the visible range used for display applications, i.e. in the 450-650 nm wavelength range, a single SLED is capable of emitting over bandwidth of at most 10-30 nm with current technology. Those emission bandwidths are too small for a display or projector application which requires red (640 nm), green (520 nm) and blue (450 nm), i.e. RGB, emission". Further, superluminescent diodes are amongst others described, in "Edge Emitting Laser Diodes and Superluminescent Diodes", Szymon Stanczyk, Anna Kafar, Dario Schiavon, Stephen Najda, Thomas Slight, Piotr Perlin, Book Editor(s): Fabrizio Roccaforte, Mike Leszczynski, First published: 3 Aug. 2020 https://doi.org/10.1002/9783527825264.ch9 in chapter 9.3 superluminescent diodes. This book, and especially chapter 9.3, are herein incorporated by reference. Amongst others, it is indicated therein that the superluminescent diode (SLD) is an emitter, which combines the features of laser diodes and light-emitting diodes. SLD emitters utilize the stimulated emission, which means that these devices operate at current densities similar to those of laser diodes. The main difference between LDs and SLDs is that in the latter case, the device waveguide may be designed in a special way preventing the formation of a standing wave and lasing. Still, the presence of the waveguide ensures the emission of a high-quality light beam with high spatial coherence of the light, but the light is characterized by low time coherence at the same time" and "Currently, the most successful designs of nitride SLD are bent, curved, or tilted waveguide geometries as well as tilted facet geometries, whereas in all cases, the front end of the waveguide meets the device facet in an inclined way, as shown in FIG. 9.10. The inclined waveguide suppresses the reflection of light from the facet to the waveguide by directing it outside to the lossy unpumped area of the device chip". Hence, an SLD may especially be a semiconductor light source, where the spontaneous emission light is amplified by stimulated emission in the active region of the device. Such emission is called "super luminescence". Superluminescent diodes combine the high power and brightness of laser diodes with the low coherence of conventional light-emitting diodes. The low (temporal) coherence of the source has advantages that the speckle is significantly reduced or not visible, and the spectral distribution of emission is much broader compared to laser diodes, which can be better suited for lighting applications. Especially, with varying electrical current, the spectral power distribution of the superluminescent diode may vary. In this way the spectral power distribution can be controlled, see e.g. also Abdullah A. Alatawi, et al., Optics Express Vol. 26, Issue 20, pp. 26355-26364, https://doi.org/10.1364/OE.26.026355.

A vertical-cavity surface-emitting laser, or VCSEL, is known in the art and may especially be a type of semiconductor laser diode with laser beam emission perpendicular from the top surface, contrary to edge-emitting semiconductor lasers (also in-plane lasers) which emit from surfaces formed by cleaving the individual chip out of a wafer. VCSELs may be tunable in emission wavelength, as known in the art. For instance, Dupont et al., Applied Physics Letters 98(16):161105-161105-3, DOI:10.1063/1.3569591, or Wendi Chang et al., Applied Physics Letters 105(7): 073303, DOI:10.1063/1.4893758, or Thor Ansbaek, IEEE Journal of Selected Topics in Quantum Electronics 19(4): 1702306-1702306, DOI:10.1109/JSTQE.2013.2257164, or C. J. Chang-Hasnain, IEEE Journal of Selected Topics in Quantum Electronics (Volume: 6, Issue: 6, November-December 2000), DOI: 10.1109/2944.902146, all document herein incorporated by reference, describe emission wavelength tunable VCSELs. Especially, with varying electrical voltage, the spectral power distribution of the VCSEL may vary.

The light generating device may comprise a plurality of different light sources, such as two or more subsets of light sources, with each subset comprising one or more light sources configured to generate light source light having essentially the same spectral power distribution, but wherein light sources of different subsets are configured to generate light source light having different spectral distributions. In such embodiments, a control system may be configured to control the plurality of light sources. In specific embodiments, the control system may control the subsets of light sources individually, see further also below.

Below, some embodiments in relation to the luminescent material are described, to return thereafter to some embodiments in relation to the first light generating device and the second light generating device (respectively).

As indicated above, the system may also comprise a luminescent material.

The term "luminescent material" especially refers to a material that can convert first radiation, especially one or more of UV radiation and blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion.

In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex} < \lambda_{em}$), though in specific embodiments the luminescent material may comprise up-converter luminescent material, i.e. radiation of a larger wavelength is converted into radiation with a smaller wavelength ($\lambda_{ex} > \lambda_{em}$).

In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence.

The term "luminescent material" may also refer to a plurality of different luminescent materials. Examples of possible luminescent materials are indicated below. Hence, the term "luminescent material" may in specific embodiments also refer to a luminescent material composition.

In embodiments, luminescent materials are selected from garnets and nitrides, especially doped with trivalent cerium or divalent europium, respectively. The term "nitride" may also refer to oxynitride or nitridosilicate, etc.

In specific embodiments the luminescent material comprises a luminescent material of the type $A_3B_5O_{12}$:Ce, wherein A in embodiments comprises one or more of Y, La, Gd, Tb and Lu, especially (at least) one or more of Y, Gd, Tb and Lu, and wherein B in embodiments comprises one or more of Al, Ga, In and Sc. Especially, A may comprise one or more of Y, Gd and Lu, such as especially one or more of Y and Lu. Especially, B may comprise one or more of Al and Ga, more especially at least Al, such as essentially entirely Al. Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

In embodiments, the luminescent material (thus) comprises $A_3B_5O_{12}$ wherein in specific embodiments at maximum 10% of B—O may be replaced by Si—N.

In specific embodiments the luminescent material comprises $(Y_{x1-x2-x3}A'_{x2}Ce_{x3})_3(Al_{y1-y2}B'_{y2})_5O_{12}$, wherein $x1+x2+x3=1$, wherein $x3>0$, wherein $0<x2+x3\leq0.2$, wherein $y1+y2=1$, wherein $0\leq y2\leq 0.2$, wherein A' comprises one or more elements selected from the group consisting of lanthanides, and wherein B' comprises one or more elements selected from the group consisting of Ga, In and Sc. In embodiments, x3 is selected from the range of 0.001-0.1. In the present invention, especially $x1>0$, such as $>0.2$, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O. As indicated above, in specific embodiments x3 may be selected from the range of 0.001-0.04. Especially, such luminescent materials may have a suitable spectral distribution (see however below), have a relatively high efficiency, have a relatively high thermal stability, and allow a high CRI (in combination with the first light source light and the second light source light (and the optical filter)). Hence, in specific embodiments A may be selected from the group consisting of Lu and Gd. Alternatively or additionally, B may comprise Ga. Hence, in embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein $0<x2+x3\leq0.1$, and wherein $0\leq y2\leq 0.1$. Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1-x3}Ce_{x3})_3Al_5O_{12}$, wherein $x1+x3=1$, and wherein $0<x3\leq0.2$, such as 0.001-0.1.

In specific embodiments, the light generating device may only include luminescent materials selected from the type of cerium comprising garnets. In even further specific embodiments, the light generating device includes a single type of luminescent materials, such as $(Y_{x1-x2-x3}A'_{x2}Ce_{x3})_3$ $(Al_{y1-y2}B'_{y2})_5O_{12}$. Hence, in specific embodiments the light generating device comprises luminescent material, wherein at least 85 weight %, even more especially at least about 90 wt. %, such as yet even more especially at least about 95 weight % of the luminescent material comprises $(Y_{x1-x2-x3}A'_xCe_{x3})_3(Al_{y1-y2}B'_{y2})_5O_{12}$. Here, wherein A' comprises one or more elements selected from the group consisting of lanthanides, and wherein B' comprises one or more elements selected from the group consisting of Ga In and Sc, wherein $x1+x2+x3=1$, wherein $x3>0$, wherein $0<x2+x3<0.2$, wherein $y1+y2=1$, wherein $0 \le y2 \le 0.2$. Especially, x3 is selected from the range of 0.001-0.1. Note that in embodiments $x2=0$. Alternatively or additionally, in embodiments $y2=0$.

In specific embodiments, A may especially comprise at least Y, and B may especially comprise at least Al.

Alternatively or additionally, wherein the luminescent material may comprises a luminescent material of the type $A_3Si_6N_{11}:Ce^{3+}$, wherein A comprises one or more of Y, La, Gd, Tb and Lu, such as in embodiments one or more of La and Y.

In embodiments, the luminescent material may alternatively or additionally comprise one or more of $M_2Si_5N_8$:$Eu^{2+}$ and/or $MAlSiN_3$:$Eu^{2+}$ and/or $Ca_2AlSi_3O_2N_5$:$Eu^{2+}$, etc., wherein M comprises one or more of Ba, Sr and Ca, especially in embodiments at least Sr. Hence, in embodiments, the luminescent may comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in CaAlSiN$_3$:Eu, the correct formula could be $(Ca_{0.98}Eu_{0.02})AlSiN_3$. Divalent europium will in general replace divalent cations, such as the above divalent alkaline earth cations, especially Ca, Sr or Ba. The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as Ba$_{1.5}$Sr$_{0.5}$Si$_5$N$_8$:Eu (i.e. 75% Ba; 25% Sr). Here, Eu is introduced and replaces at least part of M, i.e. one or more of Ba, Sr, and Ca). Likewise, the material (Ba,Sr,Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Eu in the above indicated luminescent materials is substantially or only in the divalent state, as is known to the person skilled in the art.

In embodiments, a red luminescent material may comprise one or more materials selected from the group consisting of (Ba,Sr,Ca)S:Eu, (Ba,Sr,Ca)AlSiN$_3$:Eu and (Ba,Sr,Ca)2Si5N8:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by Eu2+). For instance, assuming 2% Eu in CaAlSiN3:Eu, the correct formula could be $(Ca0.98Eu0.02)AlSiN3$. Divalent europium will in general replace divalent cations, such as the above divalent alkaline earth cations, especially Ca, Sr or Ba.

The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as Ba$_{1.5}$Sr$_{0.5}$Si$_5$N$_8$:Eu (i.e. 75% Ba; 25% Sr). Here, Eu is introduced and replaces at least part of M, i.e. one or more of Ba, Sr, and Ca).

Likewise, the material (Ba,Sr,Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Eu in the above indicated luminescent materials is substantially or only in the divalent state, as is known to the person skilled in the art.

Blue luminescent materials may comprise YSO (Y$_2$SiO$_5$:Ce$^{3+}$), or similar compounds, or BAM (BaMgAl$_{10}$O$_{17}$:Eu$^{2+}$), or similar compounds.

The term "luminescent material" herein especially relates to inorganic luminescent materials.

Instead of the term "luminescent material" also the term "phosphor". These terms are known to the person skilled in the art.

Alternatively or additionally, also other luminescent materials may be applied. For instance quantum dots and/or organic dyes may be applied and may optionally be embedded in transmissive matrices like e.g. polymers, like PMMA, or polysiloxanes, etc. etc.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content.

Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nano-wires, etcetera.

Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Different luminescent materials may have different spectral power distributions of the respective luminescent material light. Alternatively or additionally, such different luminescent materials may especially have different color points (or dominant wavelengths).

As indicated above, other luminescent materials may also be possible. Hence, in specific embodiments the luminescent material is selected from the group of divalent europium containing nitrides, divalent europium containing oxynitrides, divalent europium containing silicates, cerium comprising garnets, and quantum structures. Quantum structures may e.g. comprise quantum dots or quantum rods (or other quantum type particles) (see above). Quantum structures may also comprise quantum wells. Quantum structures may also comprise photonic crystals.

As also indicated above, a solid state material laser may comprise a luminescent material, such as a single crystal or glass comprising the luminescent material, that is used to generate laser light. Above, some examples of such lasers are provided when discussing solid state light sources, more especially laser light sources. One or more of the above embodiments in relation to luminescent materials may also apply to such solid state material lasers. However, the luminescent materials described herein as one of the at least three elements of the system may especially be configured to convert at least part of one or more of the first device light and the second device light into luminescent material light. Hence, such luminescent material may convert laser light and may not necessarily be configured such that it also generated laser light. Hence, the luminescent material light may not necessarily be laser light, though it is herein also not excluded. Especially, however, the luminescent material light generated by the luminescent material is not laser light. More especially, the luminescent material may be chosen such that an emission band of a full width half maximum (of the luminescent material light) of at least 40 nm, such as at least 50 nm is obtained. For instance, the luminescent material may be chosen such that an emission band of a full width half maximum of at least 60 nm, is obtained. This may e.g. be the case with trivalent cerium comprising garnet luminescent materials (as described herein). Hence, especially the luminescent material may comprise a broad band emitter. The luminescent material may also comprise a plurality of broad band emitters. Especially, when two or more luminescent materials are applied to convert at least part of the first device light and/or at least part of the second device light, at least two of the two or more luminescent materials may be configured to provide respective luminescent material light each having an emission band with full width half maximum (of the luminescent material light) of at least 40 nm, such as at least 50 nm.

Especially, the luminescent material light may comprise visible light. The terms "visible", "visible light" or "visible emission" and similar terms refer to light having one or more wavelengths in the range of about 380-780 nm. The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to (at least) visible light.

Especially, the first light generating device may comprise a wavelength variable light generating device. In specific embodiments, the first light generating device may comprise a (emission) color variable light generating device.

For instance, in embodiments the first light generating device comprises one or more of a vertical cavity surface emitting laser (VCSEL) and a superluminescent diode.

Hence, especially the first light generating device may provide first device light having at least two different spectral power distributions at different moments in time, respectively. Hence, especially the first light generating device is a operated in a pulsed mode.

In embodiments of an operational mode of the system, the change between the at least two different spectral power distributions may be faster than the human eye can perceive. Hence, the change between the at least two different spectral power distributions may be within 0.025 seconds, such as within 0.02 seconds, like even within about 0.0167 seconds.

The first light generating device may in embodiments sweep between (at least) two spectral power distributions, one having a first centroid wavelength $\lambda_{1c,1}$, and one having a second centroid wavelength $\lambda_{1c,2}$.

A spectral power distribution may be characterized by a centroid wavelength. The term "centroid wavelength", also indicated as λc, is known in the art, and refers to the wavelength value where half of the light energy is at shorter and half the energy is at longer wavelengths; the value is stated in nanometers (nm). It is the wavelength that divides the integral of a spectral power distribution into two equal parts as expressed by the formula $\lambda c = \Sigma \lambda * I(\lambda)/(\Sigma I(\lambda))$, where the summation is over the wavelength range of interest, and $I(\lambda)$ is the spectral energy density (i.e. the integration of the product of the wavelength and the intensity over the emission band normalized to the integrated intensity). The centroid wavelength may e.g. be determined at operation conditions.

Hence, especially the first light generating device comprises a wavelength variable light generating device configured to generate in an operational mode of the light generating system first device light changing between at least two centroid wavelengths ($\lambda_{1c,1}$, $\lambda_{1c,2}$). Hence, effectively in an operational mode the first light generating device (or more precisely its device light) may sweep between two centroid wavelength. When changing from a first centroid wavelength and a second centroid wavelength, there may be intermediate centroid wavelengths. Therefore, the term "at least two centroid wavelengths ($\lambda_{1c,1}$, $\lambda_{1c,2}$)" is used. The at least two centroid wavelengths ($\lambda_{1c,1}, \lambda_{1c,2}$) may in embodiments also be indicated as outer centroid wavelengths. The first and second centroid wavelengths ($\lambda_{1c,1}, \lambda_{1c,2}$) may have a difference of at least 10 nm, such as at least 20 nm, like at least 30 nm, or even in embodiments at least 40 nm (like even at least 60 nm, or even at least 80 nm, such as in specific embodiments at least 100 nm). In specific embodiments, a difference between the at least two centroid wavelengths ($\lambda_{1c,1}, \lambda_{1c,2}$) may be at least 50 nm. Further, the change from the first centroid wavelength to the second centroid wavelength may be with a frequency of at least 40 Hz, like at least 50 Hz, or more especially at least 60 Hz, like at least 80 Hz (and in specific embodiments (even) at least 100 Hz). Hence, in embodiments the first light generating device comprises a wavelength variable light generating device configured to generate in an operational mode of the light generating system first device light changing between at least two centroid wavelengths ($\lambda_{1c,1}, \lambda_{1c,2}$) having a wavelength difference of at least 10 nm, with a changing frequency of at least 40 Hz. Especially, the changing frequency may be at least 60 Hz.

The luminescent material may be configured to convert at least part of the first device light and/or at least part of the second device light. Hence, the luminescent material may be configured downstream of the first light generating device and/or second light generating device. The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream". Especially, the luminescent material may be configured to convert at least part of the first device light or at least part of the second device light.

Hence, the luminescent material may be configured to convert at least part of the first device light. Therefore, especially, the luminescent material and the operation conditions of the first light generating device are in the operational mode selected such that the luminescent material converts the first device light having the first centroid wavelength and the first device light having the second centroid wavelength. However, as indicated above, the luminescent material may be configured to convert at least part of the second device light. Would the second light generating device be configured to generate in an operational mode of the light generating system second device light changing between the at least two centroid wavelengths ($\lambda_{1c,1}, \lambda_{1c,2}$) having a wavelength difference of at least 10 nm, with a changing frequency of at least 40 Hz (see also below), and would the luminescent material be configured to convert at least part of the second device light, then the luminescent material and the second light generating device may in the operational mode be selected such that the luminescent material converts the second device light having the first centroid wavelength (of the second device light) and the second device light having the second centroid wavelength (of the second device light).

In an operational mode, the system may be configured to generate white light. The white light may especially comprise the luminescent material light and one or more of (a) the first device light and (b) the second device light. Even more especially, the white light may especially comprise the luminescent material light, the first device light and the second device light. Yet, in specific embodiments the white light may essentially consist of the luminescent material light, the first device light and the second device light. Hence, in embodiments the light generating system may be configured to generate in the operational mode of the light generating system white system light comprising the luminescent material light, and at least one of the first device light and the second device light.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

With the present invention, it may be possible to provide white light with a controllable CCT substantially along the black body locus, such as within 15 SDCM, more especially within 10 SDCM, yet even more especially within about 5 SDCM of the BBL. Further, especially the CCT tunability may be over at least 500 K, more especially at least 1000 K, like at least 1500 K, like even more especially at least 2000 K. For instance, the system light may be tunable between about 4500-6500 K (tunability of 2000 K), or between about 2200-4200 K (also a tunability of 2000 K), or in embodiments e.g. over 2200-6500 K (tunability of even 4300 K), though other ranges may also be possible.

Note that in further embodiments, the system may have further operational modes, wherein the system light may comprise one or more of the luminescent material light, the first device light, and the second device light. Yet, further light generating devices, configured to generate device light having a spectral power distribution different from the first device light and the second device light may in specific embodiments also be available, and contribute with their light to the system light (in operational mode(s)).

Especially, the first device light and the second device light may have different spectral power distributions. Whatever centroid wavelength the first device light may have, it may be (substantially) different from the second device light. For instance, the centroid wavelength(s) of the first device light and the centroid wavelength(s) of the second device light may differ at least 30 nm, such as at least 50 nm, like at least 80 nm. Yet, in further specific embodiments the centroid wavelength(s) of the first device light and the centroid wavelength(s) of the second device light may differ at least 60 nm, such as at least 90 nm, like at least 105 nm, or even at least about 115 nm. Further, in embodiments the spectral overlap of the smaller emission band by a larger emission band may be less than 20%, such as less than 10% of the smaller emission band.

In specific embodiments, the first light generating device and the second light generating device may essentially not be controllable to such an extent that overlapping spectral power distributions of the first device light and the second device light are obtained. Especially, the spectral overlap of the smaller emission band by a larger emission band may be less than 1%, such as less than 0.5%.

As indicated above, the first light generating device may comprise one or more light sources, especially solid state light sources. Further, the first device light may be controllable. This may imply that the light source light of the one or more light sources is controllable. For instance, the one or more light sources of the first device may comprise the above indicated one or more of a vertical cavity surface emitting laser (VCSEL) and a superluminescent diode.

As indicated above, in embodiments the first device light may essentially consist of the light source light of the one or more light sources. However, other embodiments may also be possible. For instance, although the first device light may be in the visible, it may be possible that the light source light is not in the visible. Or in embodiments the light source light may be in the red, and the first device light may be in the blue. Especially, this may be achieved when using an upconverter material. Hence, in specific embodiments the first light generating device comprises (a) a wavelength variable first light source configured to generate in an operational mode of the light generating system first light source light changing between the at least two centroid wavelengths ($\lambda_{pc,1}$, $\lambda_{pc,2}$) (primary centroid wavelengths) having a wavelength difference of at least 20 nm, with a changing frequency of at least 40 Hz, such as especially at least 50 Hz; and (b) an upconverter material configured downstream of the wavelength variable first light source and configured to convert at least part of the first light source light changing between the at least two centroid wavelengths ($\lambda_{pc,1}$, $\lambda_{pc,2}$) into the first device light changing between the at least two centroid wavelengths ($\lambda_{1c,1}$, $\lambda_{1c,2}$). Especially, the upconverter material comprises one or more of an upconverter luminescent material and a frequency doubling material.

Upconversion may e.g. be based on upconverter luminescent materials or frequency doubling conversion materials. Both are herein indicated with the general term "converter material". Upconversion may be a frequency doubling (or wavelength halving), which may be done with frequency doubling materials like second harmonic generation crystals, such as e.g. BiBO ($BiB_3O_6$), Lithium iodate $LiI_3$, BBO ($\beta$-$BaB_2O_4$), $KH_2PO_4$, etc., or based on luminescent materials, like e.g. based on the $Yb^{3+}$—$Er^{3+}$ couple (e.g. systems based on "addition de photons par transfer d'energie" (APTE), now generally known as energy transfer upconversion (ETU)), or via a two-step absorption process, such may be possible with e.g. $Er^{3+}$ based systems, or via a cooperative sensitization process, such may be possible with the $Yb^{3+}$—$Tb^{3+}$ couple, or by a cooperative luminescence process, or via a two-photon excitation process, like e.g. possible with some $Eu^{2+}$ based systems. Other couples may also be possible, e.g. $Yb^{3+}$—$Tm^{3+}$.

Another system may be based on $Pr^{3+}$, and/or one or more of $Ho^{3+}$, $Tb^{3+}$, $Tm^{3+}$, $Er^{3+}$ such as described in US2010/0297206, which is herein incorporated by reference.

For instance, in embodiments the material (which may also be indicated as "host material") may be selected from the group consisting of $NaLnF_4$, $LiLnF_4$, $KLnF_4$, $LnF_3$, $BaLn_2F_8$, $SrLn_2F_8$, $CaLn_2F_8$, $MgLn_2F_8$; wherein Ln is (a) one or more of $Pr^{3+}$, $Yb^{3+}$, $Ho^{3+}$, $Tm^{3+}$, and $Er^{3+}$; more especially wherein $Ln^{3+}$ is $Gd^{3+}$ and (b) one or more of $Pr^{3+}$, $Yb^{3+}$, $Ho^{3+}$, $Tm^{3+}$, and $Er^{3+}$, wherein the material especially comprises at least a first lanthanide ion and a second lanthanide ion, different from the first lanthanide ion. For instance, in embodiments the material may be selected from the group consisting of $NaLnF_4$, $LiLnF_4$, $NaLnF_4$, $LiLnF_4$, $KLnF_4$, $LnF_3$, $LiYF_4$, $KYF_4$, $BaLn_2F_8$, $SrLn_2F_8$, $CaLn_2F_8$, $MgLn_2F_8$, $BaLn_2F_8$, $SrLn_2F_8$, $CaLn_2F_8$, or $MgLn_2F_8$, wherein Ln comprises (a) one or more of first lanthanide ions selected from the group of $Gd^{3+}$, $Pr^{3+}$, $Tm^{3+}$, or $Er^{3+}$ and (b) one or more second lanthanide ions selected from the group of $Pr^{3+}$, $Yb^{3+}$, $Ho^{3+}$, $Tm^{3+}$, $Er^{3+}$, wherein the material comprises at least a first lanthanide ion and a second lanthanide ion, different from the first lanthanide ion. Especially, in embodiments Ln may comprise one or more of Lu and La, and at least one or more first lanthanide ions and one or more second lanthanide ions. Further, especially in embodiments Ln may comprise at least Gd, and optionally one or more of Lu and La, and at least one or more second lanthanide ions.

Further, it may also be possible to use semiconductor nanoparticles. For example, nanocrystals of perovskite $CsPbBr_3$ with molecular synthesizer showed more than 10% conversion efficiency emitting in the range 340-400 nm by excitation 440 nm may be obtained. For instance, it is referred to Wieghold S, Nienhaus L Correction: Engineering 3D perovskites for photon interconversion applications. PLOS ONE 15(4): e0232196. https://doi.org/10.1371/journal.pone.0232196.

Other up-conversion examples may e.g. be UV $Pr^{3+}$ doped crystals like $Lu_7O_6F_9$:$Pr^{3+}$ or $Y_2SiO_5$:$Pr^{3+}$), or $NaYF_4$:$Yb^{3+}$, $Tm^{3+}$. Other examples can be found in Bright Infrared-to-Ultraviolet/Visible Upconversion in Small Alkaline Earth-Based Nanoparticles with Biocompatible CaF2 Shells—Fischer—2020—Angewandte Chemie International Edition—Wiley Online Library, which is herein incorporated by reference, and which describes NIR-to-UV/visible emission of sub-15 nm alkaline-earth rare-earth fluoride UCNPs ($M_{1-x}Ln_xF_{2+x}$, MLnF) with a $CaF_2$ shell. Different alkaline-earth host materials doped with $Yb^{3+}$ and $Tm^{3+}$, with alkaline-earth (M) spanning Ca, Sr, and Ba, MgSr, CaSr, CaBa, SrBa, and CaSrBa.

Further, it is referred to US2010/0297206, which is herein incorporated by reference. Further information about upconversion can also be found in e.g. G. Blasse et al., Luminescent Materials, Springer Verlag 1994, chapter 10.1. Hence, in embodiments the first converter material may comprise an upconverter luminescent material. Alternatively or additionally, the first converter material may comprises a frequency doubling (crystalline) material.

As indicated above, in embodiments the luminescent material may comprise a luminescent material of the type $A_3B_5O_{12}$:Ce, wherein A comprises one or more of Y, La, Gd, Tb and Lu, and wherein B comprises one or more of Al, Ga, In and Sc.

In embodiments, the luminescent material may be comprised by a single crystal, a glass, or a ceramic body. In specific embodiments, the system may (thus) comprise a ceramic body, wherein the ceramic body comprises the luminescent material.

Above, the first light generating device has been described in more detail. The second light generating device may especially also comprise a solid state light source, such as a solid state material light source. Especially, the second light generating device may comprise one or more of a diode laser and a superluminescent diode. Yet, in embodiments the second light generating device comprises a vertical cavity surface emitting laser (VCSEL).

Hence, in specific embodiments the second light generating device may also comprise a wavelength variable light generating device. Therefore, in embodiments the second light generating device may comprise a (emission) color variable light generating device.

Hence, in specific embodiments the second light generating device may comprise a wavelength variable light generating device configured to generate in an operational mode of the light generating system second device light changing between the at least two centroid wavelengths ($\lambda_{1c,1}$, $\lambda_{1c,2}$) having a wavelength difference of at least 10 nm, such as at least 30 nm, like even at least 40 nm, with a changing frequency of at least 40 Hz, especially at least 50 Hz, like even more especially at least 60 Hz, like at least 80 Hz, (and in specific embodiments (even) at least 100 Hz). Hence, in specific embodiments the second light generating device may be operated in a pulsed mode.

Hence, in specific embodiments the second light generating device may provide second device light having at least two different spectral power distributions at different moments in time, respectively.

As indicated above, in embodiments of an operational mode of the system, the change between the at least two different spectral power distributions may be faster than the human eye can perceive. Hence, the change between the at least two different spectral power distributions may be within 0.025 seconds, such as within 0.02 seconds, like even within about 0.0167 seconds.

Hence, the second light generating device may in embodiments sweep between (at least) two spectral power distributions, one having a first centroid wavelength $\lambda_{2c,1}$, and one having a second centroid wavelength $\lambda_{2c,2}$.

Further, the second light generating device may also comprise an upconversion material. Hence, embodiments described in relation to the first light generating device may also apply in relation to the second light generating device. However, the devices are especially selected such that the first device light and the second device light have different spectral power distributions (see also above).

Assuming upconversion in case of the first light generating device, the first light generating device may in embodiments comprise an IR VCSEL or IR superluminescent diode. Assuming upconversion in case of the second light generating device, the second light generating device may in embodiments comprise an IR VCSEL or IR superluminescent diode.

In embodiments, the luminescent material may be configured to generate luminescent material light having a color point in the green, yellow or orange, especially in the green or yellow. Further, in embodiments the first light generating device may be configured to generate blue light or red light. Yet, in embodiments the second light generating device may be configured to generate red light or blue light. Hence, in specific embodiments, (a) the first light generating device may be configured to generate first device light having a centroid wavelength in the blue wavelength range and wherein the second light generating device is configured to generate second device light having a centroid wavelength in the red wavelength range; or (b) the first light generating device may be configured to generate first device light having a centroid wavelength in the red wavelength range and wherein the second light generating device is configured to generate second device light having a centroid wavelength in the blue wavelength range.

The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The term "cyan" may refer to one or more wavelengths selected from the range of about 490-520 nm. The term "amber" may refer to one or more wavelengths selected from the range of about 585-605 nm, such as about 590-600 nm. The phrase "light having one or more wavelengths in a wavelength range" and similar phrases may especially indicate that the indicated light (or radiation) has a spectral power distribution with at least intensity or intensities at these one or more wavelengths in the indicate wavelength range. For instance, a blue emitting solid state light source will have a spectral power distribution with intensities at one or more wavelengths in the 440-495 nm wavelength range.

In specific embodiments, the system may further comprise a control system configured to control the system light, especially in dependence of one or more of an input signal of a user interface, a sensor signal of a sensor, and a timer, and especially by (individually) controlling the first light generating device and the second light generating device.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. The device is thus not necessarily coupled to the lighting system, but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

The system, or apparatus, or device may execute an action in a "mode" or "operation mode" or "mode of operation" or "operational mode". The term "operational mode may also be indicated as "controlling mode". Likewise, in a method an action or stage, or step may be executed in a "mode" or "operation mode" or "mode of operation" or "operational mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme.

It may also be desirable to tune a spectral power composition of the system light. This may especially be done by controlling the first light generating device and the second light generating device. Especially, this may be done by controlling a duty cycle of the first device light (and/or optionally of the second device light). In this way, it may be possible to keep the (change) frequency of the first device light essentially the same, but the spectral power distribution can be controlled by increasing or shortening the pulse time of the respective pulse for the first or second centroid wavelengths. Hence, in embodiments the control system may be configured to control the first light generating device by pulse width modulation, wherein the control system is configured to control a spectral power distribution of the system light in the operational mode by controlling a duty cycle of the first device light. Especially, in embodiments the wavelength variable light generating device is configured to generate in the operational mode first pulses of first device light having the centroid wavelength ($\lambda_{1c,1}$) and second pulses of first device light having the centroid wavelength ($\lambda_{1c,2}$), each with a pulse frequency of at least 40 Hz (more especially at least 50 Hz, yet even more especially at least 60 Hz), wherein controlling the spectral power distribution of the system light in the operational mode comprises individually controlling a duty cycle of first pules and a duty cycle of the second pulses.

Hence, in embodiments a pulse width modulation may be applied to control the spectral power distribution of the first device light, and thereby the system light. An alternative solution to control the spectral power distribution of the first device light may also be possible, such as by controlling the pulse height(s). Note that it may also be possible to control the spectral power distribution of the system light by controlling the second device light. This may in specific embodiments also be done via pulse width modulation, though other solutions, such as varying the power provided to the second light generating device may also be applied.

Further, in specific embodiments the luminescent material may comprise a luminescent material of the type $A_3B_5O_{12}$:Ce, wherein A may comprise one or more of Y, La, Gd, Tb and Lu, and wherein B may comprise one or more of Al, Ga, In and Sc; the light generating system may comprise a ceramic body, wherein the ceramic body may comprise the luminescent material; wherein the second light generating device may comprise one or more of a diode laser and a superluminescent diode; wherein the first light generating device may be configured to generate first device light having a centroid wavelength in the blue wavelength range and wherein the second light generating device may be configured to generate second device light having a centroid wavelength in the red wavelength range.

Yet further, in specific embodiments the control system may be configured to control in an operational mode of the light generating system the system light within a correlated color temperature range of 2000-6500 K, such as 2200-6500 K, even more especially 2700-6500 K. Alternatively or additionally, the control system may be configured to control in an operational mode of the light generating system the system light with a color rendering index of at least 80. Hence, especially the control system may be configured to control in an operational mode of the light generating system the system light within a correlated color temperature range of 2700-6500 K and a having color rendering index of at least 80.

The light generating system may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting. The light generating system (or luminaire) may be part of or may be applied in e.g. optical communication systems or disinfection systems.

In yet a further aspect, the invention also provides a lamp or a luminaire comprising the light generating system as defined herein. The luminaire may further comprise a housing, optical elements, louvres, etc. etc. The lamp or luminaire may further comprise a housing enclosing the light generating system. The lamp or luminaire may comprise a light window in the housing or a housing opening, through which the system light may escape from the housing. In yet a further aspect, the invention also provides a projection device comprising the light generating system as defined herein. Especially, a projection device or "projector" or "image projector" may be an optical device that projects an image (or moving images) onto a surface, such as e.g. a projection screen. The projection device may include one or more light generating systems such as described herein. Hence, in an aspect the invention also provides a light generating device selected from the group of a lamp, a luminaire, a projector device, a disinfection device, and an optical wireless communication device, comprising the light generating system as defined herein. The light generating device may comprise a housing or a carrier, configured to house or support, one or more elements of the light generating system. For instance, in embodiments the light generating device may comprise a housing or a carrier, configured to house or support one or more of the first light generating device, the second light generating device, and the luminescent material.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Wavelength tunable VCSEL are e.g. available in the red-IR range using MEMs. Such light sources can be used by e.g. frequency doubling for producing wavelength tunable laser in the blue region. In addition to this VCSELs emitting in the blue region have been appearing and their efficiency and power has already reached above several watts.

Here below, it is described how a BBL tunable white light source can be produced using such wavelength tunable lasers. Wavelength tuning can in embodiments be done using a wavelength tunable blue laser, a red laser (may also be wavelength tunable) and a ceramic phosphor for converting partially the blue light.

Figure 1:
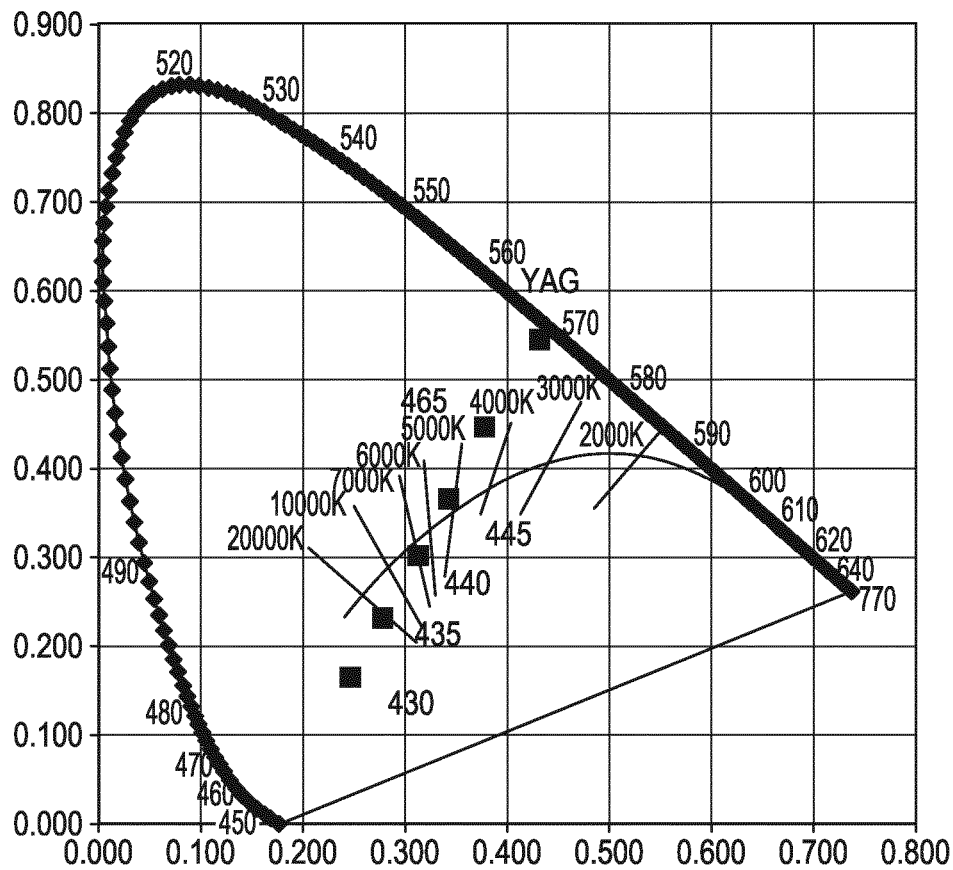
FIGS. 1-7 schematically depict some embodiments and examples.

If we consider a Ce doped YAG ceramic with an absorbance of 0.42 at 465 nm which is close the peak absorbance. Using the absorbance curve of Ce:YAG as a function of wavelength we can calculate the amount of blue light going through the ceramic and the yellow emitted by Ce:YAG as a result absorbed blue light. FIG. 1 shows the color point at discrete blue wavelengths.

Figure 2:
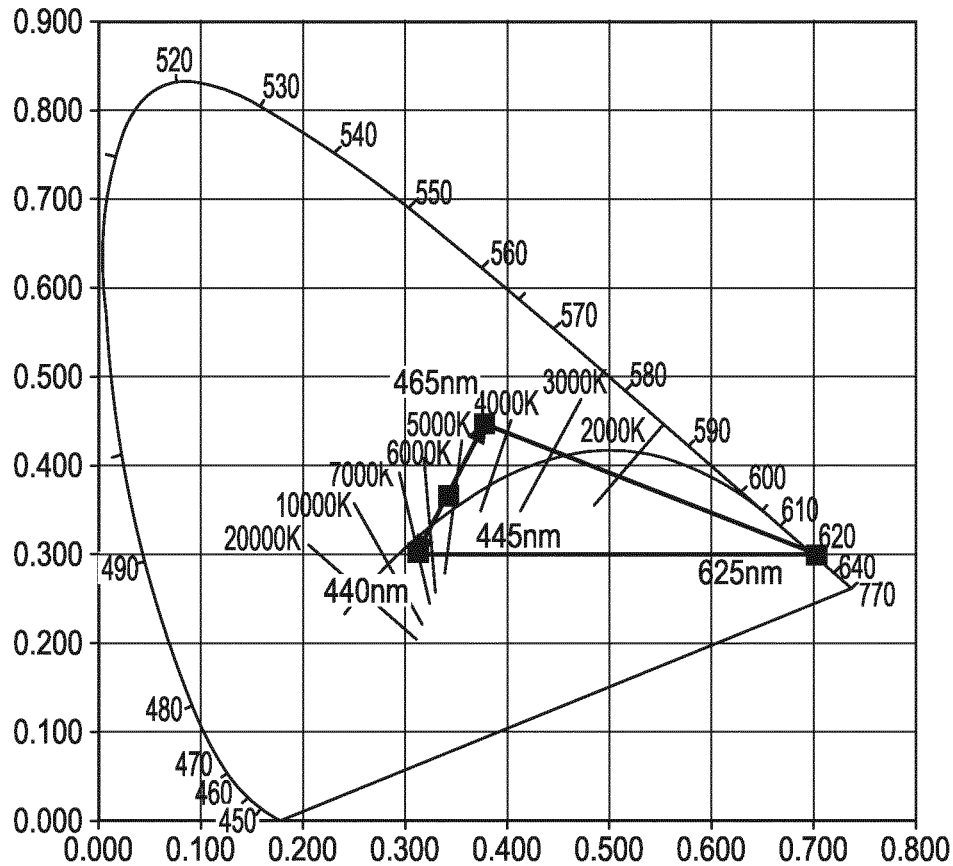

For example, would a light source be used which can sweep between 440 nm and 465 nm and combine it with a laser emitting at 625 nm then it is possible to make a light source which can produce any color point within the triangle shown in FIG. 2. Varying the CCT along the BBL may then be possible in the range of about 3000-7000 K.

It may is also be possible to move the color point continuously along the BBL between 7000 K and 2700 K by sweeping the blue laser light continuously between 440 nm and 460 nm and by adjusting the relative intensities of blue and red light sources.

Figure 3:
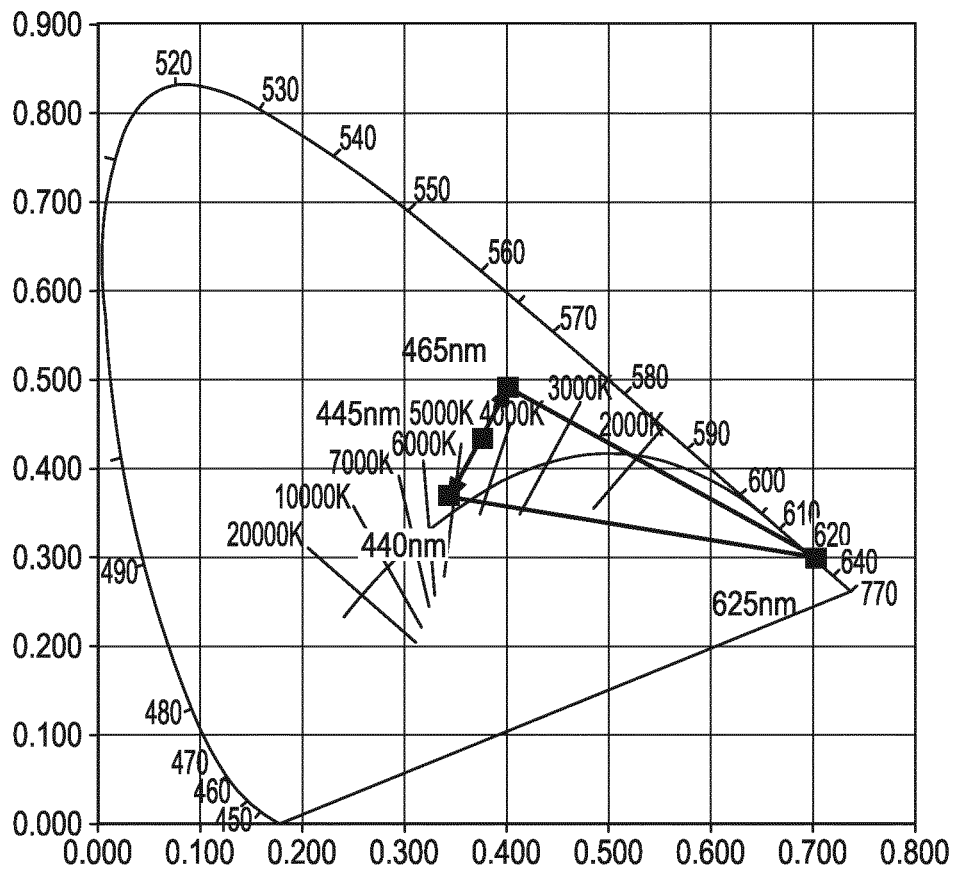

In FIG. 3 the use of a YAG ceramic is shown with an absorbance of 0.56 at 465 nm and use a light source which can sweep between 440 nm and 465 nm and combined with a laser emitting at 625 nm. It is now possible to make a light source which can produce any color point within the triangle shown in FIG. 3. This allows e.g. sweeping (of the system light) between about 4800 K and 2200 K.

Table 1 shows the characteristics of the white light on the BBL at the wavelengths obtained during the scanning:

| Absorbance | Blue nm (fraction %) | Red nm (fraction %) | YAG fraction % | CCT | CRI | R9 |
|---|---|---|---|---|---|---|
| 0.42 | 465 (9) | 625 (29) | 61 | 2718 | 89 | 73 |
| 0.42 | 445 (21) | 625 (6) | 73 | 4655 | 72 | 12 |
| 0.42 | 440 (32) | 0 | 68 | 6906 | 64 | −14 |
| 0.56 | 465 (4) | 625 (43) | 53 | 2091 | — | — |
| 0.56 | 445 (10) | 625 (25) | 65 | 2898 | 88 | 95 |
| 0.56 | 440 (20) | 625 (7) | 73 | 4438 | 71 | 21 |

Laser-phosphor based light sources are gathering much interest due to their potential in producing extremely high intensities. There are already products such as car head lights and projectors on the market where lasers are used for pumping phosphor. Laser-phosphor can also be used for other lighting applications. However, for BBL dimming at least a red, a green and a blue individually controllable laser based light sources are needed.

Amongst others, BBL dimming is herein proposed using (at least) a high frequency wavelength sweeping laser and a ceramic phosphor. The high frequency wavelength sweeping laser may be a VCSEL which can be switched between orange light and red light. By using such source in combination with a blue laser and a YAG/LuAG ceramic phosphor tile the BBL can be followed e.g. for BBL dimming. Alternatively, or in addition, a blue (or green) high frequency wavelength sweeping laser may be used for adjusting the blue (or green) wavelength. PWM (pulse width modulation) may be used to control the intensity of the lasers.

Figure 4:
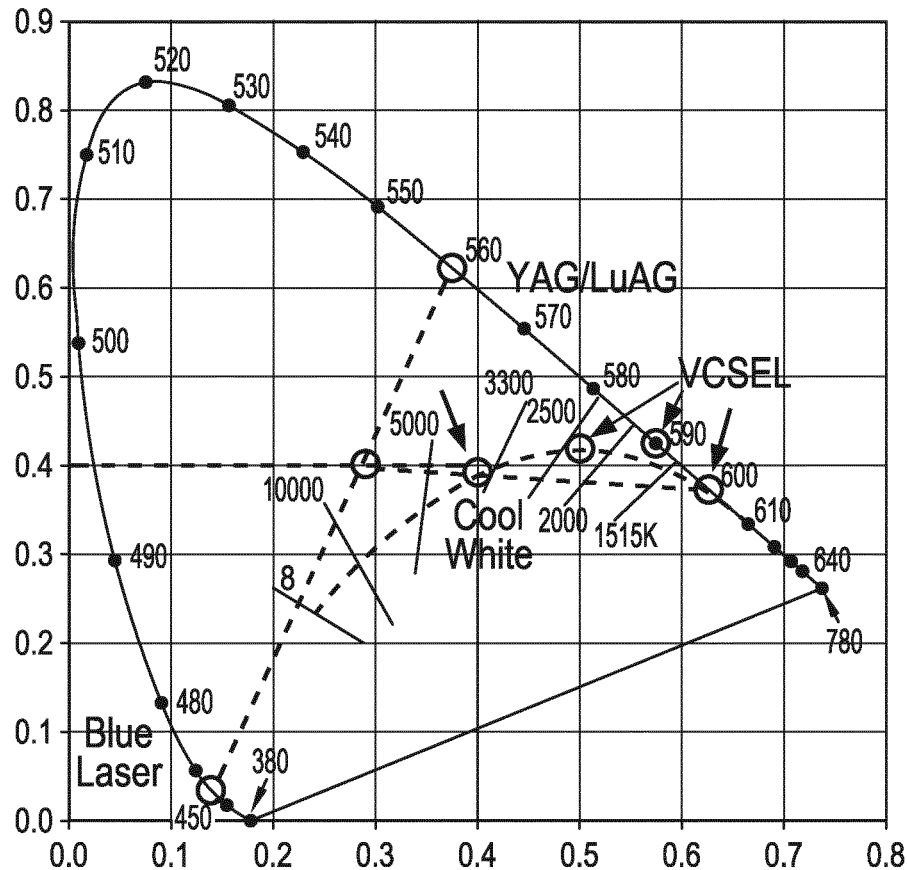

FIG. 4 schematically depicts several color points that are available with a blue laser at about 450 nm, a green/yellow emitting material with color point at 560 nm and a VCSEL emitting at about orange/red at different wavelengths. Note that the white light may have a controllable CCT (substantially along the black body locus). The different circles indicate color points that can be chosen in dependence of the centroid wavelength of the wavelength tunable device light, such as a VCSEL (which is by way of example indicated).

Amongst others, herein also the use of tunable lasers in producing lighting sources with adjustable properties such as (i) the color temperature, (ii) the CRI and/or (iii) the R9 value are suggested. It can also be used for other effects which need to be compensated. Amongst others, it is proposed using wavelength tunable IR vertical-cavity surface-emitting lasers (VCSELs) in combination with suitable non-linear optical (NLO) crystals for second harmonic generation and thus obtaining tunable visible lasers.

Figure 5:
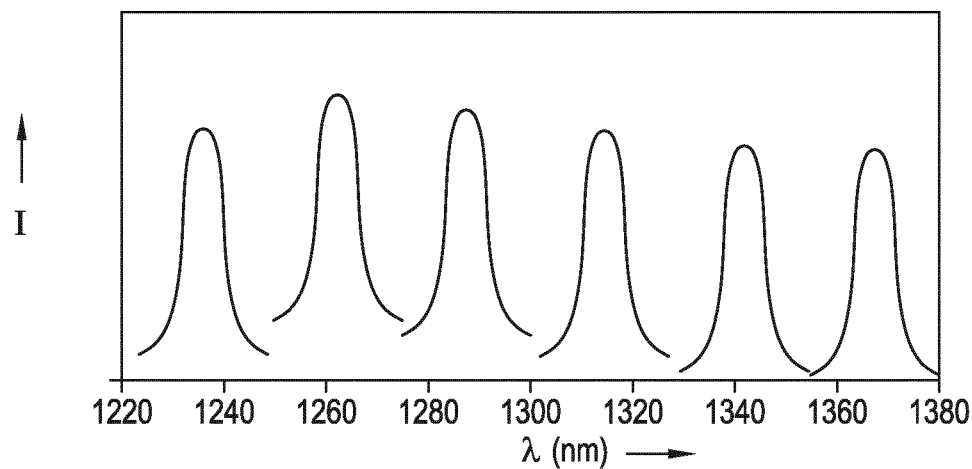

FIG. 5 schematically depicts spectra of a possible wavelength tunable VCSEL.

For example, the tunable visible laser light can be used to adjust the color point/color temperature. This can be achieved directly by the tunable visible laser light or indirectly by pumping a phosphor wherein the conversion rate depends on the pump wavelength. For the later configuration color separation elements (e.g. a dichroic for separating laser beams) may be used to enhance the effect. A number of peaks is shown. Intermediate peaks may also be possible.

Or, for example, it is known that level of absorbance from a garnet phosphor at a given wavelength decreases with increasing temperature. As a result of this the color point of the light source changes as a function of light intensity. A tunable blue laser can be used for compensating the temperature absorbance and hence keeping the color point of the phosphor with changing temperature.

In embodiments, after frequency doubling of a tunable IR laser emitting a wavelength range from 1240 to 1350 nm a tunable red emitting laser emitting light in a wavelength range from 620 to 675 nm range can be obtained. Hence, with wavelength tunable light sources, which are tunable in the IR, also wavelength tunable light sources, which are tunable in the visible, may be obtained (see further also below).

In the same way, tunable IR emitting lasers in the wavelength range from 900 to 990 nm and 990 to 1140 nm can be used for producing tunable lasers emitting in blue 450-495 nm and green 495-570 nm, respectively.

Figure 6:
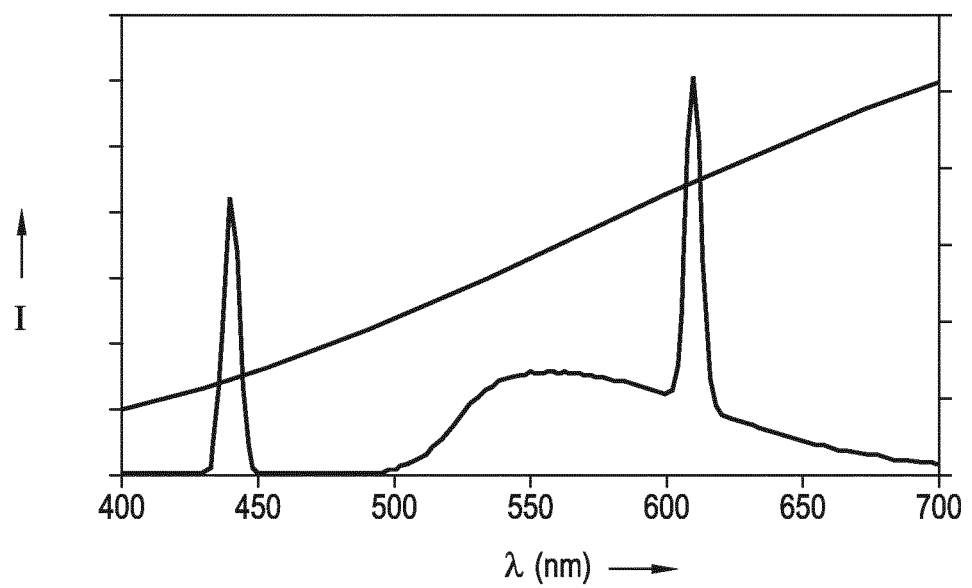

FIG. 6 shows a spectrum of a light source comprising a blue laser of 440 nm pumping a YAG:Ce 2% phosphor in combination with red laser light at 610 nm. Light at CCT=3000 K with CRI=66, R9=−64 and a conversion efficiency of 373 lm/W may e.g. be obtained. The continuous increasing curve schematically depicts the spectral power distribution of a black body radiator at about 3000 K (see also FIG. 7).

Figure 7:
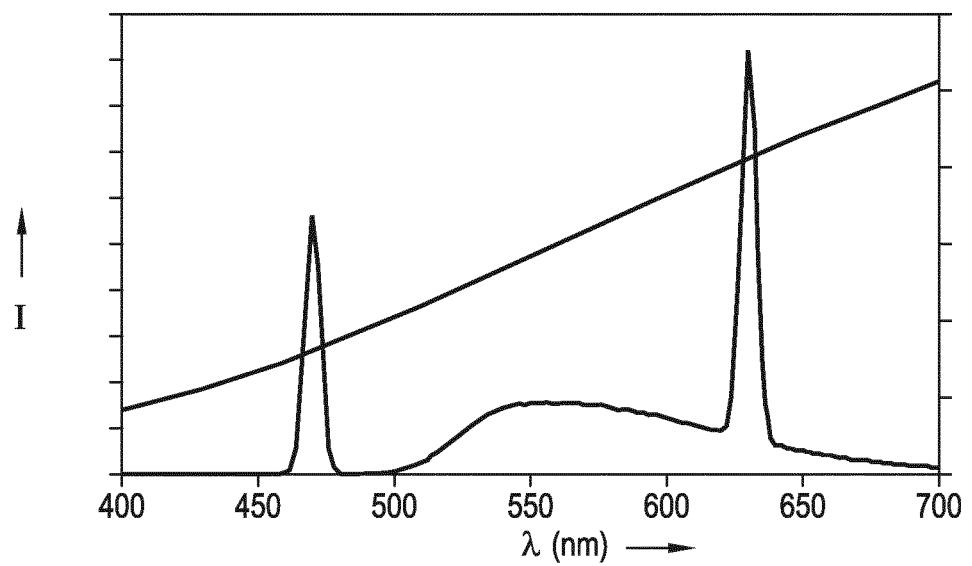

FIG. 7 shows the spectrum with higher light quality i.e. CRI=90 and R9=92 at the same CCT=3000 K but lower efficiency of 330 Lm/W obtained with blue laser 470 nm and red laser 630 nm.

Figure 8A:
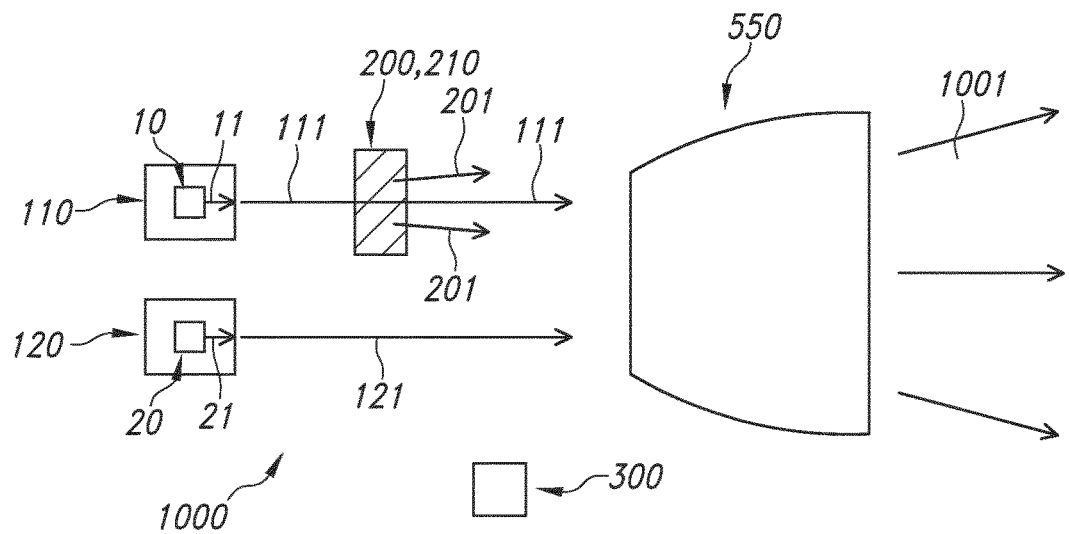
FIG. 8a-9c schematically depict some embodiments and aspects.

With reference to FIG. 8a, in embodiments, a light generating system 1000 may comprise a first light generating device 110, a second light generating device 120, and a luminescent material 200.

The first light generating device 110 may be configured to generate first device light 111. The second light generating device 120 may be configured to generate second device light 121. The first device light 111 and the second device light 121 have different spectral power distributions.

The luminescent material 200 may be configured to convert at least part of one or more of the first device light 111 and the second device light 121 into luminescent material light 201. The luminescent material 200 may comprise a luminescent material of the type $A_3B_5O_{12}:Ce^{3+}$. A may comprise one or more of Y, La, Gd, Tb and Lu, and B may comprise one or more of Al, Ga, In and Sc. The light generating system 1000 may comprise a ceramic body 210, and the ceramic body 210 may comprise the luminescent material 200. Reference 550 refers to optics, which may e.g. comprise a beam shaping element like a collimator or lens. Other optics, not depicted, may also be possible. Especially, optics 550 refer to optics configured downstream of the first light generating device, the second light generating device, and the luminescent material.

In embodiments, the light generating system 1000 may further comprise a control system 300 configured to control the system light 1001 in dependence of one or more of an input signal of a user interface, a sensor signal (of a sensor), and a timer, by controlling the first light generating device 110 and the second light generating device 120.

Figure 8B:
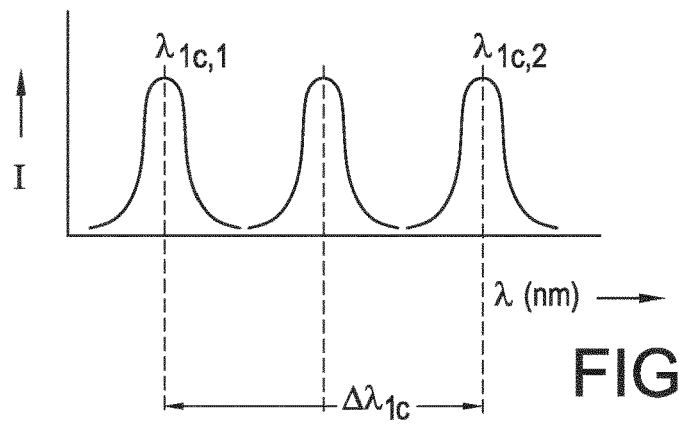

Referring to FIGS. 8a-8b, the first light generating device 110 (see FIG. 8a) may comprise a wavelength variable light generating device configured to generate in an operational mode of the light generating system 1000 first device light 111 changing between at least two centroid wavelengths ($\lambda_{1c,1}$, $\lambda_{1c,2}$) having a wavelength difference (indicated in the drawing as $\lambda_{1c}$) of at least 10 nm, with a changing frequency of at least 40 Hz. The changing frequency may especially be at least 50 Hz, such as even more especially at least 60 Hz. The smallest wavelength band (on the left) may have centroid wavelengths $\lambda_{1c,1}$, and the largest wavelength band (on the right) may have centroid wavelengths $\lambda_{1c,2}$. Hence, these at least two centroid wavelengths $\lambda_{1c,1}$, $\lambda_{1c,2}$ may be indicated as outer centroid wavelengths.

The light generating system 1000 may be configured to generate in the operational mode of the light generating system 1000 white system light 1001 comprising the luminescent material light 201, and (at least one of) the first device light 111 and the second device light 121.

In specific embodiments of the light generating system 1000, the first light generating device 110 may comprise one or more of a vertical cavity surface emitting laser (VCSEL) and a superluminescent diode.

Figure 8C:
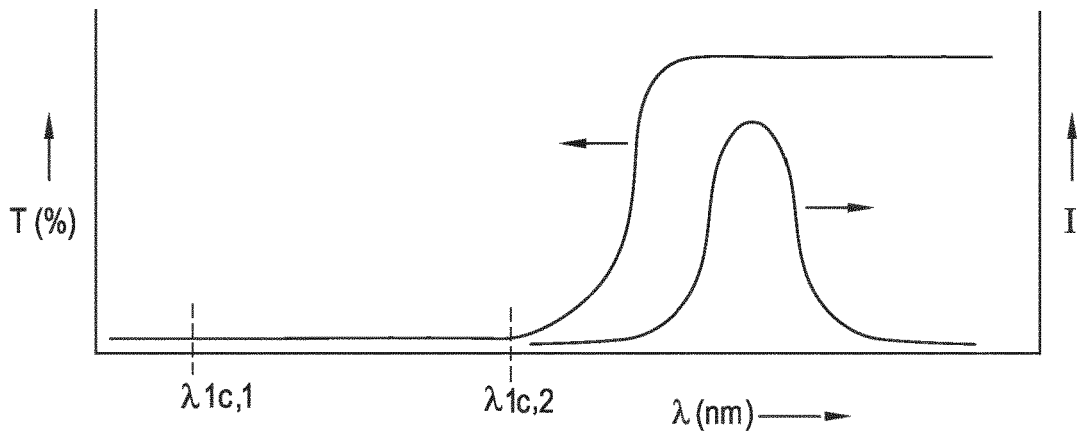

FIG. 8c schematically depicts an embodiment of the absorption (transmission) (left y-axis) and emission (right y-axis) of a luminescent material, wherein the luminescent material is configured to convert part of the first device light having a controllable centroid wavelength (see FIG. 8b).

Figure 8D:
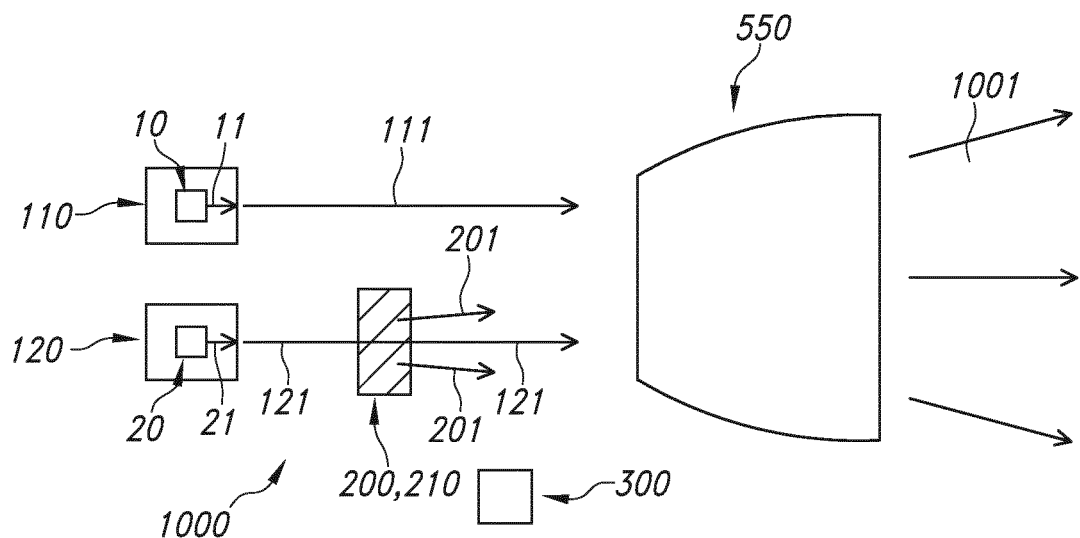

FIG. 8d schematically depicts an embodiment wherein the luminescent material is configured to convert part of the second device light 121. Further, the schematically depicted embodiment is essentially the same as the embodiment schematically depicted in FIG. 8a.

Figure 8E:
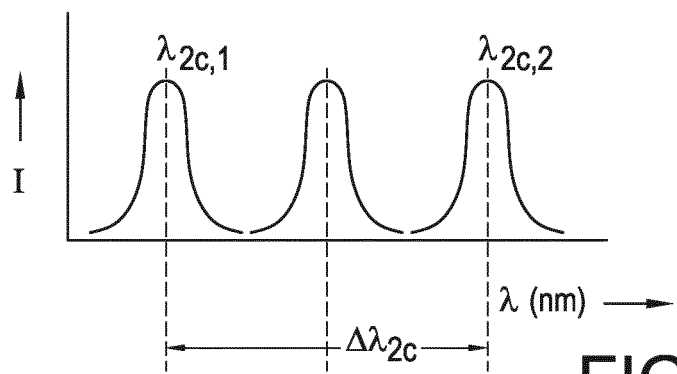

FIG. 8e schematically depicts an embodiment wherein the second light generating device 120 may comprise a wavelength variable light generating device configured to generate in an operational mode of the light generating system 1000 second device light 121 changing between the at least two centroid wavelengths ($\lambda_{2c,1}$, $\lambda_{2c,2}$) having a wavelength difference of at least 10 nm, with a changing frequency of at least 40 Hz, especially at least 50 Hz, such as at least 60 Hz.

Figure 8F:
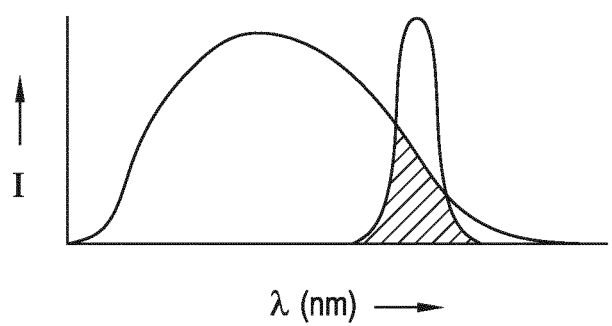

FIG. 8f schematically depicts an aspect of possible overlapping (emission) bands. The overlapping area is hatched. The percentage of overlap is larger for the smaller band than for the larger (here broader) band. Herein, overlap may especially be defined relative to the smaller emission band, the spectral overlap of the smaller emission band by a larger emission band may be less than 20%. Especially, an emission band may be smaller than another emission band when the spectral power (integrated power) of the former is smaller than of the latter. In FIG. 8f, the overlap may be about 50% (of the narrow-band emission)(only about 10% of the broad band emission may overlap with the narrow-band emission).

Figure 9A:
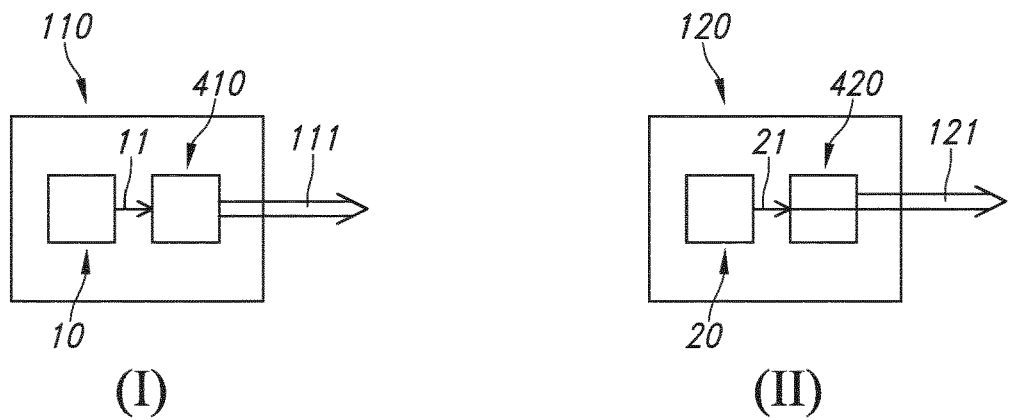
Figure 9B:
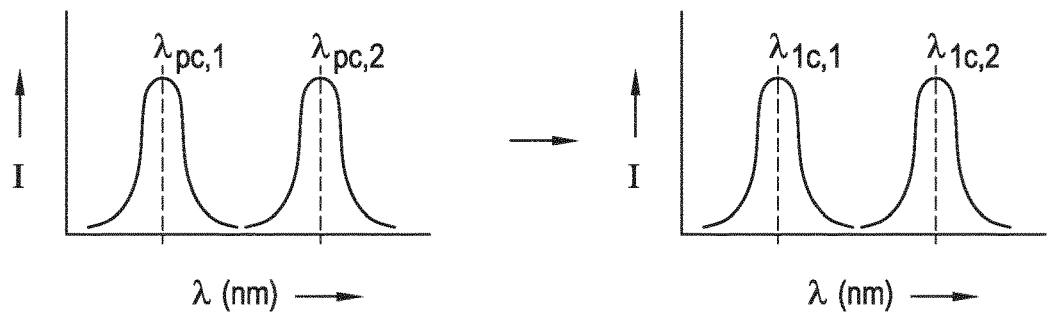

Referring to FIGS. 9a-9b, embodiment I, the first light generating device 110 may comprise (a) a wavelength variable first light source 10 configured to generate in an operational mode of the light generating system 1000 first light source light 11 changing between the at least two centroid wavelengths ($\lambda_{pc,1}$, $\lambda_{pc,2}$) having a wavelength difference of at least 20 nm, with a changing frequency of at least 50 Hz. Further, an (first) upconverter material 410 configured downstream of the wavelength variable first light source 10 and configured to convert at least part of the first light source light 11 changing between the at least two centroid wavelengths ($\lambda_{pc,1}$, $\lambda_{pc,2}$) into the first device light 111 changing between the at least two centroid wavelengths ($\lambda_{1c,1}$, $\lambda_{1c,2}$).

The upconverter material 410 may comprise one or more of an upconverter luminescent material and a frequency doubling material.

In embodiments, the second light generating device 120 may comprise one or more of a diode laser and a superluminescent diode. In embodiments, the second light generating device 120 may comprise a vertical cavity surface emitting laser (VCSEL).

Hence, in embodiment II of FIG. 9a, such embodiment is schematically depicted wherein the second light generating device 120 comprises a second light source 20 configured to generate in an operational mode of the light generating system 1000 second light source light 21 changing between the at least two centroid wavelengths having a wavelength difference of at least 20 nm, with a changing frequency of at least 50 Hz. Further, an (second) upconverter material 420 configured downstream of the wavelength variable second light source 20 and configured to convert at least part of the second light source light 21 changing between the at least two centroid wavelengths into the second device light 121 changing between the at least two centroid wavelengths.

The first light generating device 110 may be configured to generate first device light 111 having a centroid wavelength in the blue wavelength range and the second light generating device 120 may be configured to generate second device light 121 having a centroid wavelength in the red wavelength range. Alternatively, the first light generating device 110 may be configured to generate first device light 111 having a centroid wavelength in the red wavelength range and the second light generating device 120 may be configured to generate second device light 121 having a centroid wavelength in the blue wavelength range.

In embodiments, the first light source 10 may comprise an IR superluminescent diode or IR VCSEL.

The control system (not depicted, but see e.g. FIG. 8a or 8d) may be configured to control the first light generating device 110 by pulse width modulation. Especially, the control system may be configured to control a spectral power distribution of the system light 1001 in the operational mode by controlling a duty cycle of the first device light 111.

The wavelength variable light generating device may be configured to generate in the operational mode first pulses of first device light 111 having the centroid wavelength ($\lambda_{1c,1}$) and second pulses of first device light 111 having the centroid wavelength ($\lambda_{1c,2}$), each with a pulse frequency of at least 40 Hz, wherein controlling the spectral power distribution of the system light 1001 in the operational mode may comprise individually controlling a duty cycle of first pules and a duty cycle of the second pulses.

Note that the control system may in embodiments (also) be configured to control the second light generating device by pulse width modulation.

Figure 9C:
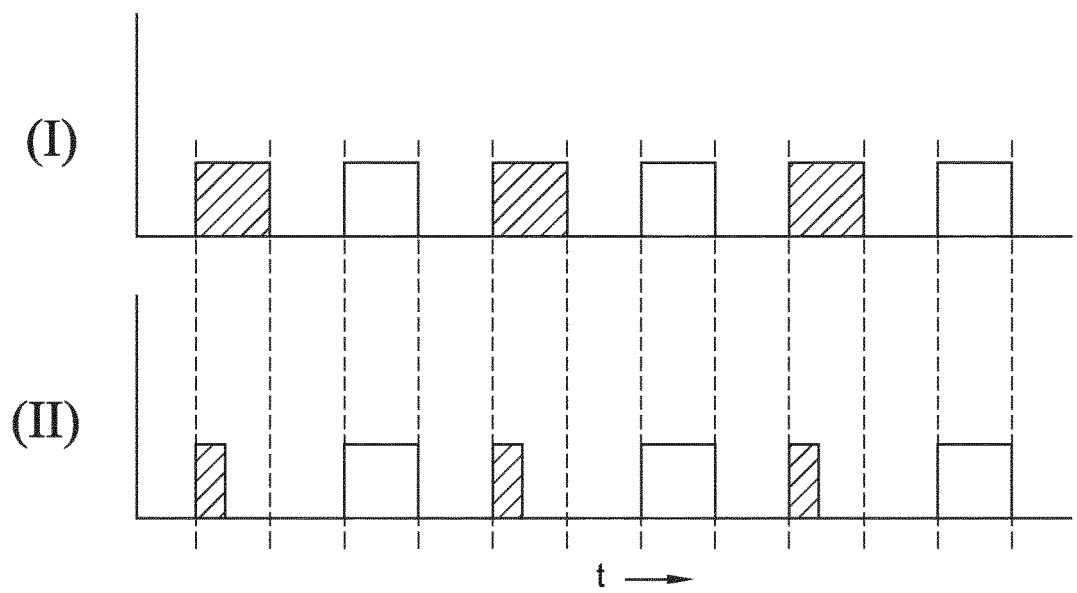

Referring to FIG. 9c, examples of pulse width modulation are schematically depicted. By shortening the pulse width in the second embodiment, the contribution of the light provided in the first type of pulses to the system light is reduced. In this way, the color may be tuned, e.g. along the BBL. The two different pulses, indicated with non-hatched and hatched rectangles may refer to pulses of e.g. first device light having centroid wavelengths $\lambda_{1c,1}$, $\lambda_{1c,2}$, respectively. In this way, the light generating device may sweep between two (or more) different spectral power distributions, by which—especially with PWM—the spectral power distribution of the system light may be controlled.

The control system may be configured to control in an operational mode of the light generating system 1000 the system light 1001 within a correlated color temperature range of 2700-6500 K and having a color rendering index of at least 80.

Figure 10:
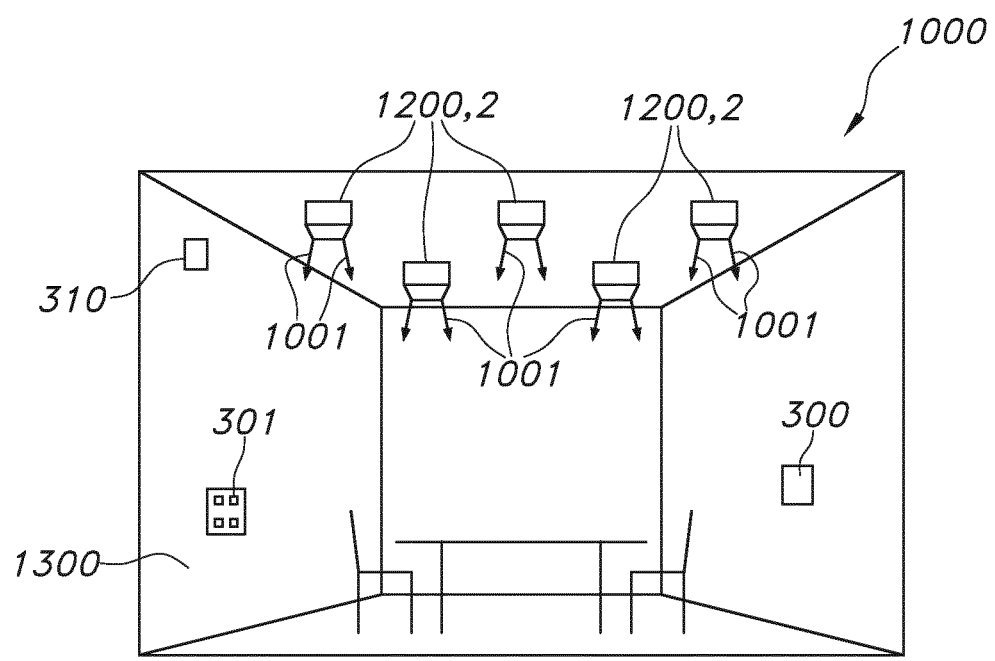
FIG. 10 schematically depict some applications.

FIG. 10 schematically depicts an embodiment of a luminaire 2 comprising the light generating system 1000 as described above. Reference 301 indicates a user interface which may be functionally coupled with the control system 300 comprised by or functionally coupled to the light generating system 1000. FIG. 10 also schematically depicts an embodiment of lamp 1 comprising the light generating system 1000. Hence, FIG. 10 schematically depicts embodiments of a lighting device 1200 selected from the group of a lamp 1, a luminaire 2, a projector device, a disinfection device, and an optical wireless communication device, comprising the light generating system 1000 as described herein. In embodiments, such lighting device may be a lamp 1, a luminaire 2, a projector device, a disinfection device, or an optical wireless communication device. Lighting device light escaping from the lighting device 1200 is indicated with reference 1201. Lighting device light 1201 may essentially consist of system light 1001, and may in specific embodiments thus be system light 1001.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage. In yet a further aspect, the invention (thus) provides a software product, which, when running on a computer is capable of bringing about (one or more embodiments of) the method as described herein.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

Especially, the invention may provide a combination of a wavelength sweeping laser and a phosphor, and a second laser. In embodiments, the wavelength sweeping laser may be a red laser and the second laser a blue laser, and in another embodiment vice versa.

The invention claimed is:

1. A light generating system comprising a first light generating device, a second light generating device, and a luminescent material, wherein:
the first light generating device is configured to generate first device light; the second light generating device is configured to generate second device light; wherein the first device light and the second device light have different spectral power distributions;
the luminescent material is configured to convert at least part of one or more of the first device light and the second device light into luminescent material light;
the first light generating device comprises a wavelength variable light generating device configured to generate in an operational mode of the light generating system first device light changing between at least two centroid wavelengths ($\lambda_{1c,1}$, $\lambda_{1c,2}$) having a wavelength difference of at least 10 nm, with a changing frequency of at least 50 Hz; and
the light generating system is configured to generate in the operational mode of the light generating system white system light comprising the luminescent material light, the first device light and the second device light.

2. The light generating system according to claim 1, wherein the first light generating device comprises one or more of a vertical cavity surface emitting laser and a superluminescent diode.

3. The light generating system according to claim 1, wherein the luminescent material comprises a luminescent material of the type $A_3B_5O_{12}$:Ce, wherein A comprises one or more of Y, La, Gd, Tb and Lu, and wherein B comprises one or more of Al, Ga, In and Sc.

4. The light generating system according to claim 1, comprising a ceramic body, wherein the ceramic body comprises the luminescent material.

5. The light generating system according to claim 1, wherein the second light generating device comprises one or more of a diode laser and a superluminescent diode.

6. The light generating system according to claim 1, wherein the second light generating device comprises a wavelength variable light generating device configured to generate in an operational mode of the light generating system second device light changing between the at least two centroid wavelengths ($\lambda_{2c,1}$, $\lambda_{2c,2}$) having a wavelength difference of at least 10 nm, with a changing frequency of at least 50 Hz.

7. The light generating system according to claim 1, wherein:
the first light generating device is configured to generate first device light having a centroid wavelength in the blue wavelength range and wherein the second light generating device is configured to generate second device light having a centroid wavelength in the red wavelength range; or
the first light generating device is configured to generate first device light having a centroid wavelength in the red wavelength range and wherein the second light generating device is configured to generate second device light having a centroid wavelength in the blue wavelength range.

8. The light generating system according to claim 1, wherein the luminescent material comprises a luminescent material of the type $A_3B_5O_{12}$: Ce, wherein A comprises one or more of Y, La, Gd, Tb and Lu, and wherein B comprises one or more of Al, Ga, In and Sc; the light generating system comprising a ceramic body, wherein the ceramic body comprises the luminescent material; wherein the second light generating device comprises one or more of a diode laser and a superluminescent diode; wherein the first light generating device is configured to generate first device light having a centroid wavelength in the blue wavelength range and wherein the second light generating device is configured to generate second device light having a centroid wavelength in the red wavelength range.

9. The light generating system according to claim 1, wherein the control system is configured to control in an operational mode of the light generating system the system light within a correlated color temperature range of 2700-6500 K and having a color rendering index of at least 80.

10. A light generating device selected from the group of a lamp (1), a luminaire (2), a projector device, a disinfection device, and an optical wireless communication device, comprising the light generating system according to claim 1.

11. The light generating system according to claim 1, wherein the first light generating device comprises (a) a wavelength variable first light source configured to generate in an operational mode of the light generating system first light source light changing between the at least two centroid wavelengths ($\lambda_{pc,1}$, $\lambda_{pc,2}$) having a wavelength difference of at least 20 nm, with a changing frequency of at least 60 Hz; and (b) an upconverter material configured downstream of the wavelength variable first light source and configured to convert at least part of the first light source light changing between the at least two centroid wavelengths ($\lambda_{pc,1}$, $\lambda_{pc,2}$) into the first device light changing between the at least two centroid wavelengths ($\lambda_{1c,1}$, $\lambda_{1c,2}$).

12. The light generating system according to claim 11, wherein the upconverter material comprises one or more of an upconverter luminescent material and a frequency doubling material.

13. The light generating system according to claim 1 further comprising a control system configured to control the system light in dependence of one or more of an input signal of a user interface, a sensor signal, and a timer, by individually controlling the first light generating device and the second light generating device.

14. The light generating system according to claim 13, wherein the control system is configured to control the first light generating device by pulse width modulation, wherein the control system is configured to control a spectral power distribution of the system light in the operational mode by controlling a duty cycle of the first device light.

15. The light generating system according to claim 14, wherein the wavelength variable light generating device is configured to generate in the operational mode first pulses of first device light having the centroid wavelength ($\lambda_{1c,1}$) and second pulses of first device light having the centroid wavelength ($\lambda_{1c,2}$), each with a pulse frequency of at least 50 Hz, wherein controlling the spectral power distribution of the system light in the operational mode comprises individually controlling a duty cycle of first pules and a duty cycle of the second pulses.

* * * * *